United States Patent
Kudose et al.

(10) Patent No.: US 8,129,825 B2
(45) Date of Patent: Mar. 6, 2012

(54) IC CHIP PACKAGE EMPLOYING SUBSTRATE WITH A DEVICE HOLE

(75) Inventors: Satoru Kudose, Osaka (JP); Tomokatsu Nakagawa, Osaka (JP); Tatsuya Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 12/312,981

(22) PCT Filed: Nov. 30, 2007

(86) PCT No.: PCT/JP2007/073189
§ 371 (c)(1),
(2), (4) Date: Jun. 3, 2009

(87) PCT Pub. No.: WO2008/069135
PCT Pub. Date: Jun. 12, 2008

(65) Prior Publication Data
US 2010/0019394 A1     Jan. 28, 2010

(30) Foreign Application Priority Data
Dec. 6, 2006  (JP) .................................. 2006-329993

(51) Int. Cl.
*H01L 23/495* (2006.01)
(52) U.S. Cl. ................. 257/668; 438/123; 257/E23.023

(58) Field of Classification Search .................... 257/668
See application file for complete search history.

(56) References Cited

U.S. PATENT DOCUMENTS
7,180,185 B2 *  2/2007  Ohsumi ....................... 257/737
2007/0290302 A1  12/2007  Nakagawa et al.

FOREIGN PATENT DOCUMENTS
JP    04-180243      6/1992
JP    11-330167      11/1999
JP    2004-207566    7/2004

OTHER PUBLICATIONS
International Search Report dated Mar. 4, 2008 for corresponding application No. PCT/JP2007/073189.

* cited by examiner

*Primary Examiner* — Ajay K Arora
(74) *Attorney, Agent, or Firm* — Harness, Dickey & Pierce, P.L.C.

(57) ABSTRACT

In one embodiment of the present invention, an IC chip mounting package includes a film base member and an IC chip connected via an interposer. Connecting terminals on the film base member side of the interposer are provided so as to have a pitch larger than that of connecting terminals of the IC. A device hole is opened to the film base member, and the IC chip is provided in the device hole. A distance between an inner lead leading end and a periphery of the device hole is set as not less than 10 μm.

16 Claims, 9 Drawing Sheets

F I G. 1
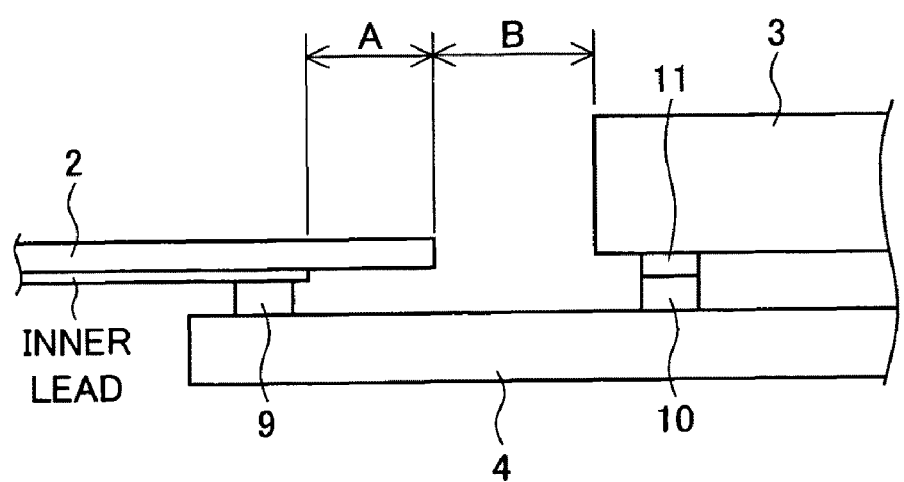

F I G. 7
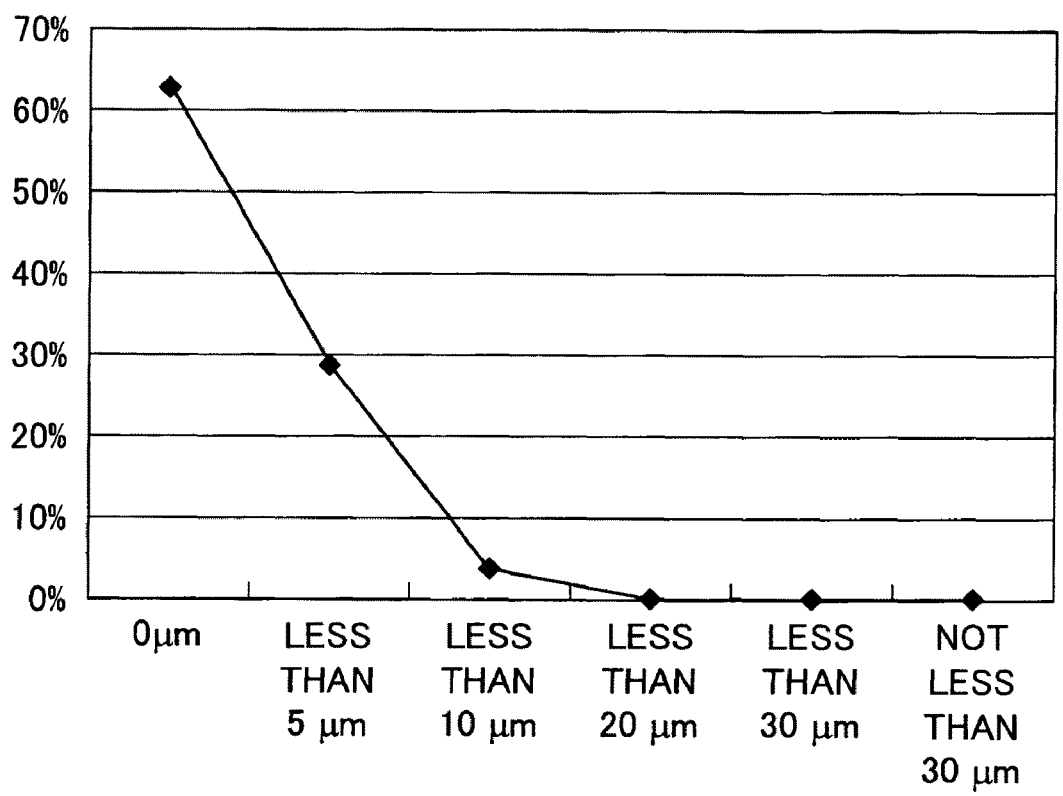

F I G. 8
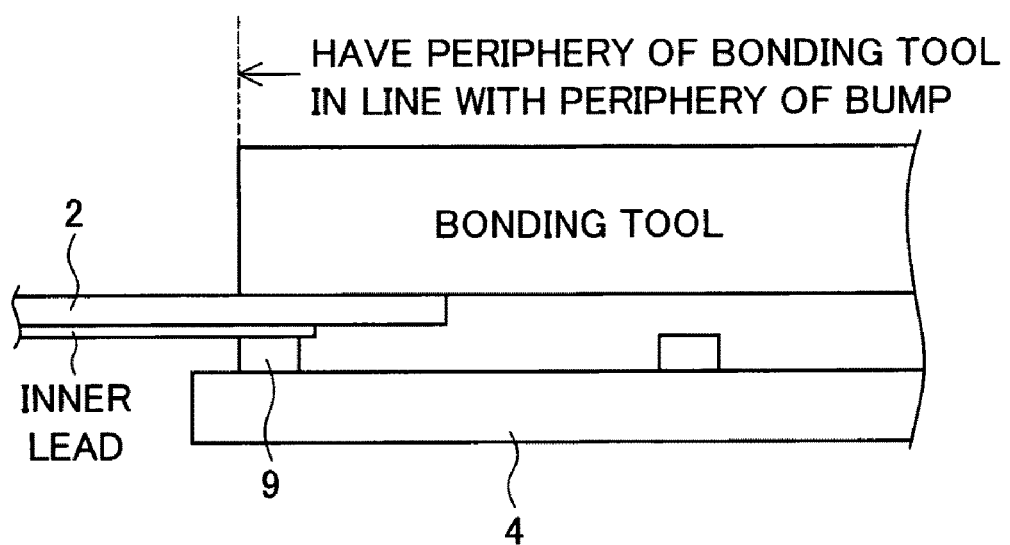

F I G. 1 1
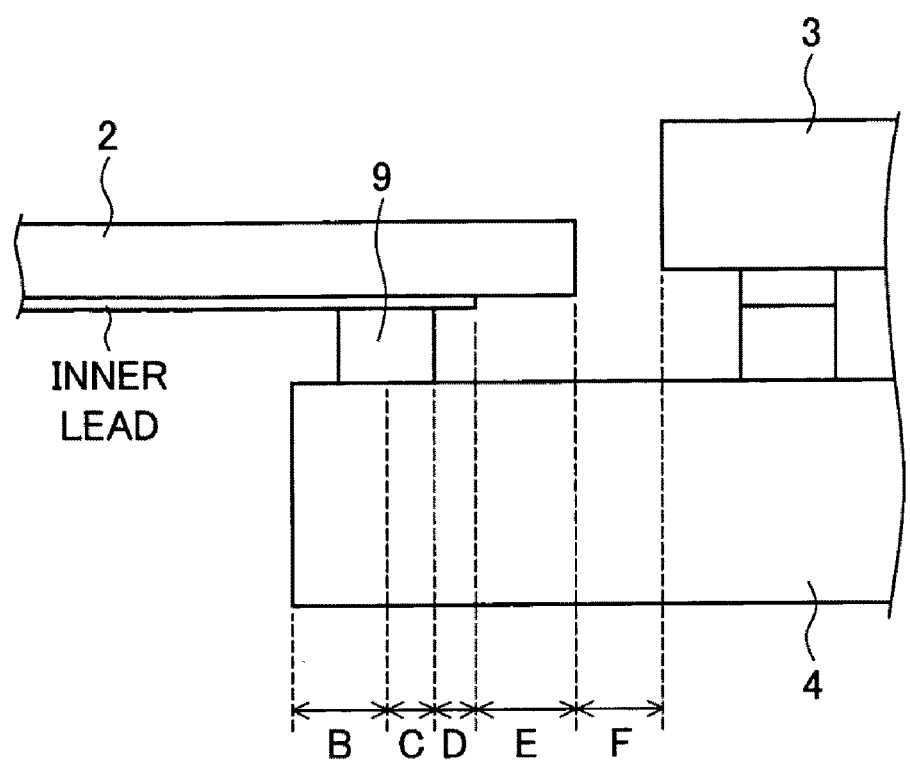

IC CHIP PACKAGE EMPLOYING SUBSTRATE WITH A DEVICE HOLE

TECHNICAL FIELD

The present invention relates to a package for mounting an IC chip which includes, for example, finely pitched terminals.

BACKGROUND ART

With the development of a liquid crystal display apparatus with high definition and high performance, a liquid crystal driver (IC chip) incorporated in the liquid crystal display apparatus is required to have an increased number of outputs, and also a reduced chip size.

In order to accomplish the increased number of outputs in an IC chip reduced in chip size, it is required for the chip to have bumps made in a fine pitch (smaller pitch). Recently, an SOF (System On Film, also referred to as COF (Chip On Film)) is often used. The SOF can realize the fine pitch and includes a bare chip liquid crystal driver.

In the latest SOF package, inner leads on a tape carrier are bonded to bumps on an IC chip by the application of heat and pressure so that the tape carrier is brought into conduction with the IC chip. However, such a bonding method requires a very fine tape carrier material which is less susceptible to heat deformation to prevent misalignment between bumps and inner leads. In other words, the realization of a fine pitch limits a choice of a material for a tape carrier.

Moreover, the inner leads are made of copper foil; in order to carry out wire processing in fine pitch, it is required to reduce thickness of the copper foil. For example, a copper foil for a TCP having a pitch of 50 μm has a thickness of 12 μm; in order to form a pitch of 20 μm, the thickness of the copper foil requires to be around 5 μm. In order to maintain strength while providing a thin copper foil, it is required to introduce new techniques and new processing apparatuses by reviewing the currently used techniques. This causes costs required in labor work for discussing the techniques and costs for introducing new equipment.

Furthermore, in the wire processing, if a processing accuracy of the processing apparatus sufficiently surpasses a wire pitch, a test that follows the processing may be carried out to just a simple degree. However, if the wires are finely pitched, and the processing accuracy is closer to the wire pitch, a thorough test is necessarily carried out after the processing, of whether or not there is a part left that is insufficiently processed, or the like. This causes an increase in testing costs.

As a method of solving such a problem, Patent Literature 1 (Japanese Patent Application Publication, Tokukai, No. 2004-207566 A (published on Jul. 22, 2004) discloses a method in which an IC chip is connected to a circuit board (tape carrier) via an interposer substrate. FIG. 14 illustrates a cross sectional view of a package structure described in Patent Literature 1.

As illustrated in FIG. 14, an IC chip 104 is connected to an interposer 101 by flip chip bonding. The interposer 101 is further connected to a terminal pattern 110 of a circuit board 107 by bump bonding. The circuit board 107 has a device hole 107A which corresponds to a region in which the IC chip 104 is provided.

The interposer 101 is a silicon (Si) substrate and is formed in a Si wafer process. This makes it possible to form electrodes of the interposer 101 which electrodes are connected to the electrodes of the IC chip 104, at a pitch as fine as that of the electrodes of the IC chip 104. On the other hand, electrodes of the interposer 101 which electrodes are connected to the circuit board 107 are formed at a pitch that agrees with a pitch of the electrodes of the circuit board 107, which pitch is relatively large. The electrodes connected to the IC chip 104 are connected to the corresponding electrodes connected to the circuit board 107, on the interposer 101. As the circuit board 107, a tape carrier can be used.

In other words, the interposition of the interposer 101 as illustrated in FIG. 14 allows a fine pitch of the IC process to be changed to an electrode pitch of the tape carrier. Hence, it is possible to avoid increase in manufacturing cost and testing costs even with the use of an SOF package in which an IC chip whose connecting terminals are provided at a very fine pitch is included for reduced size or increased outputs of the IC chip.

Citation List

Patent Literature 1

Japanese Patent Application Publication, Tokukai, No. 2004-207566 A (Publication Date: Jul. 22, 2004)

SUMMARY OF INVENTION

However, the structure in Patent Literature 1 has problems such that inner leads peel off and tape undulates at a periphery of the device hole 107A, at a time when the device hole 107A is opened to the circuit board 107 in manufacturing steps of the device hole 107A.

The following description explains about inner lead peeling. The inner lead peeling occurs at a punching step for opening the device hole 107A to the circuit board 107. Namely, the punching step for forming the device hole 107A is carried out to the circuit board 107 on which the wires have been formed; a turn-up of a Cu pattern (i.e., inner lead peeling) easily occurs around the device hole 107A due to deformation that occurs to a base member upon punching the circuit board 107.

Next is a description explaining undulation of tape. The undulation of tape generates at a bonding step for bonding the interposer 101 to the circuit board 107. That is to say, the interposer 101 is bonded to the circuit board 107 by applying heat and pressure to a bonding position by use of a bonding tool. A heating temperature at this time is around 400° C. This heat causes the base member to expand, thereby causing the tape to undulate around the device hole 107A.

These inner lead peeling and undulation of tape both occur remarkably when a tape carrier is used as the circuit board 107.

The present invention is accomplished in view of these problems, and its object is to realize an IC chip mounting package which can avoid inner lead peeling and undulation of tape.

An IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, and leading ends of the first connecting terminals being provided so as to be away from a periphery of the device hole by not less than 10 μm.

According to the structure, the IC chip and the package base member are connected via the interposer, and the IC chip is provided inside a device hole of the package base member. With this structure, wires provided on the package base member peels off at a punching step for opening the device hole, due to deformation of the package base member.

In regards to this, leading ends of connection terminals of the package base member are provided so as to be away from a periphery of the device hole by not less than 10 μm. This allows providing wires so as to avoid a region of the package base member which bends at the punching step. Hence, peeling off of the wires is suppressed.

Moreover, another IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, and leading ends of the first connection terminals being provided so as to be away from a periphery of the device hole by not more than 150 μm.

According to the structure, the IC chip and the package base member are connected via the interposer, and the IC chip is provided inside a device hole of the package base member. With this structure, the package base member is made as a free end at a periphery of the device hole due to bonding heat at the time of bonding the interposer to the package base member. This easily causes undulation of the package base member.

In regards to this, leading ends of the connection terminals of the package base member are provided so as to be away from a periphery of the device hole by not more than 150 μm. This reduces a size of a heated region (region at which thermal expansion occurs) at the time of bonding. As a result, the undulation of the package base member is suppressed.

Moreover, a method in accordance with the present invention for manufacturing an IC chip mounting package, the IC chip mounting package including an IC chip having input/output terminals and a package base member for mounting the IC chip, the package base member having first connection terminals, the method including the step of: connecting the IC chip and the package base member via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the package base member and the interposer being connected by bonding bump electrodes to the respective first connecting terminals, the bump electrodes being provided on the respective first connecting terminals, the bonding being carried out by using a bonding tool that has a dimension so that a periphery of the bonding tool and a periphery of the bump electrodes are in line with each other.

According to the structure, the package base member has a smallest possible heated region to which heat is applied by the bonding tool. This suppresses the undulation of the package base member.

BRIEF DESCRIPTION OF DRAWINGS

FIG. 1 illustrates an embodiment of the present invention, and is a cross sectional view illustrating a structure of a bonding part of a film base member, an IC chip, and an interposer, in an IC chip mounting device.

FIG. 7 is a graph illustrating a relation between (i) a distance from inner lead leading ends to a periphery of a device hole and (ii) a percent defective of the inner lead peeling.

FIG. 8 is a cross sectional view illustrating a bonding step for bonding an interposer to a film base member, in the IC chip mounting package illustrated in FIG. 2.

FIG. 11 is an explanatory view illustrating a suitable range of a distance between a periphery of an IC chip and a periphery of the interposer.

DESCRIPTION OF EMBODIMENTS

One embodiment of the present invention is described below with reference to FIGS. 1 through 13. The present embodiment illustrates an example in which an IC chip mounting package of the present invention is applied to a liquid crystal driver mounting package (hereinafter referred to simply as a mounting package). The following description includes various limitations. These are technically preferred in the implementation of the present invention, but by no means limiting the scope of the present invention.

Figure 2:
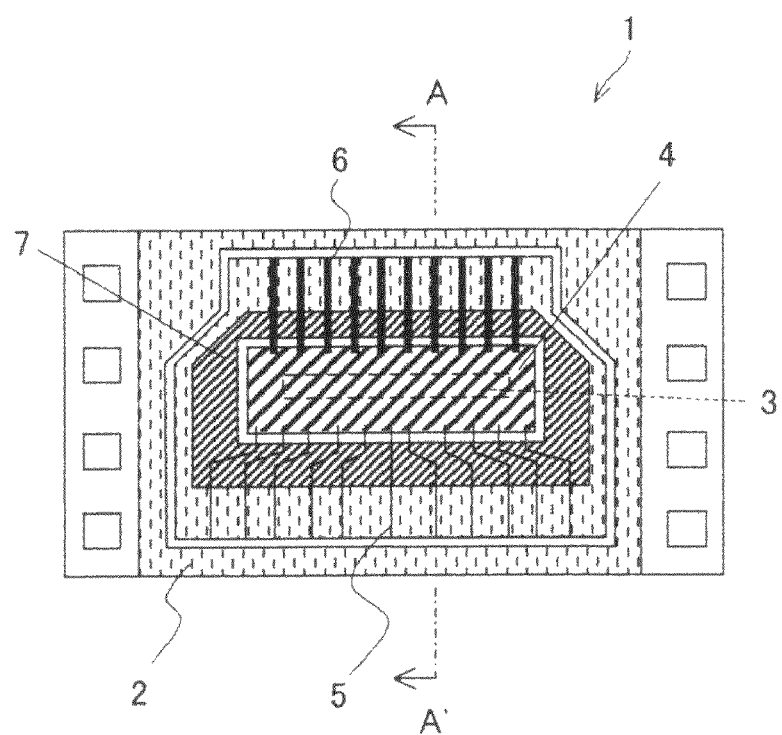
FIG. 2 is a plan view illustrating a structure of an IC chip mounting package in accordance with the present embodiment.
Figure 3:
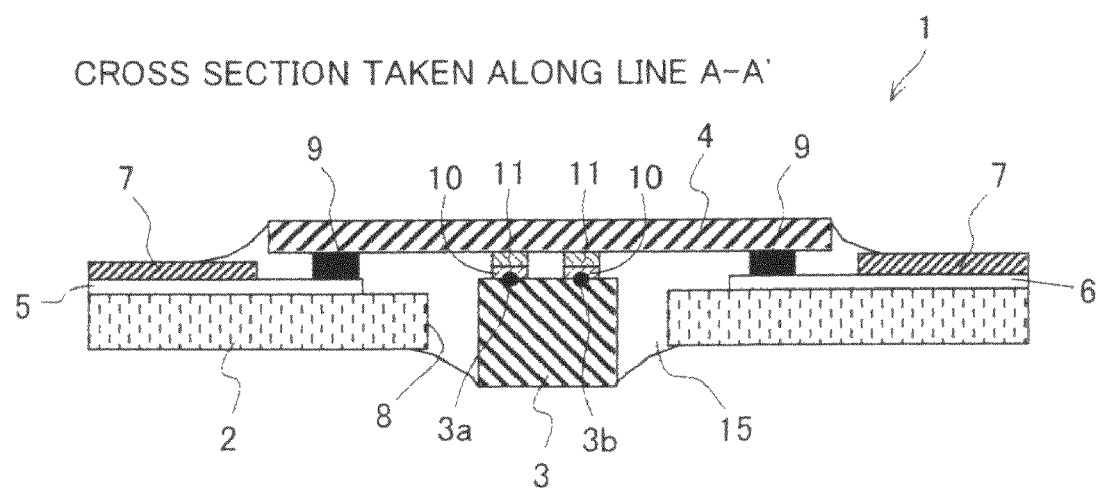
FIG. 3 is a cross sectional view illustrating a cross section of the IC chip mounting package taken on line A-A' illustrated in FIG. 2.

FIG. 2 is a plan view illustrating a structure of an IC chip mounting package 1 in accordance with the present embodiment. FIG. 3 is a cross sectional view of the IC chip mounting package 1 taken along line A-A of FIG. 2.

The mounting package 1 briefly is arranged including a film base member (tape carrier) 2, an IC chip 3, and an interposer 4. FIG. 2 illustrates the mounting package 1 from a side on which the interposer 4 is provided. For convenience in explanation, FIG. 3 is illustrated so as to have the IC chip 3 face downwards in the figure. FIG. 3 illustrates one part of a cross section taken along line A-A'.

In the mounting package 1, the film base member 2 has a hole section called a device hole 8, and the IC chip 3 is provided inside the device hole 8.

The film base member 2 has on-film wires 5 and 6 provided around the device hole 8. The on-film wires 5 and 6 are electrically connected to the interposer 4 at ends on the device hole 8 side, via first bumps 9. Since the interposer 4 is electrically connected to the IC chip 3, the on-film wires 5 and 6 become electrically connected to the IC chip 3 via the interposer 4. That is to say, the on-film wires 5 are output wires for sending signals (for example drive signals) outputted from the IC chip 3 to a liquid crystal display (not illustrated), and the on-film wires 6 are input wires for inputting control signals (for example image data signals) to the IC chip 3. Details of this arrangement are described later.

The on-film wires 5 and 6 have solder resists 7 provided thereon. The solder resist 7 insulates and protects the wires.

In the present liquid crystal driver mounting package, the IC chip 3 is provided as a liquid crystal driver for driving a liquid crystal display. For this reason, the IC chip 3 has a plurality of liquid crystal drive circuits (not illustrated). The liquid crystal drive circuits include, as illustrated in FIG. 3, drive signal output terminals 3a via which respective drive signals are outputted, and signal input terminals 3b (input/output terminals) via which image data signals and other signals are respectively inputted. Moreover, the IC chip 3 has third bumps 10 for each of the drive signal output terminals 3a and the signal input terminals 3b.

The interposer 4 has one of its sides electrically connected to the IC chip 3 and the film base member 2. More specifically, the interposer 4 has the first bumps 9 and second bumps 11 provided on one of its sides, and as illustrated in FIG. 3, the film base member 2 and the interposer 4 are electrically connected via the first bumps 9, and the IC chip 3 and the interposer 4 are electrically connected by connecting respective second bumps 11 and third bumps 10. Semiconductor material may be used as material for the interposer 4; preferably, silicon is used. The interposer 4 is not particularly limited in its size, however may be of a size of 2 mm×20 mm with a thickness of 400 μm, for example.

Sealing resin 15 illustrated in FIG. 3 is provided so as to cover the device hole 8 of the film base member 2, the on-film wires 5 and 6, and a side of the interposer 4 on which the first and second bumps are provided. The sealing resin 15 is provided for protecting this connecting section from external environment.

Figure 4:
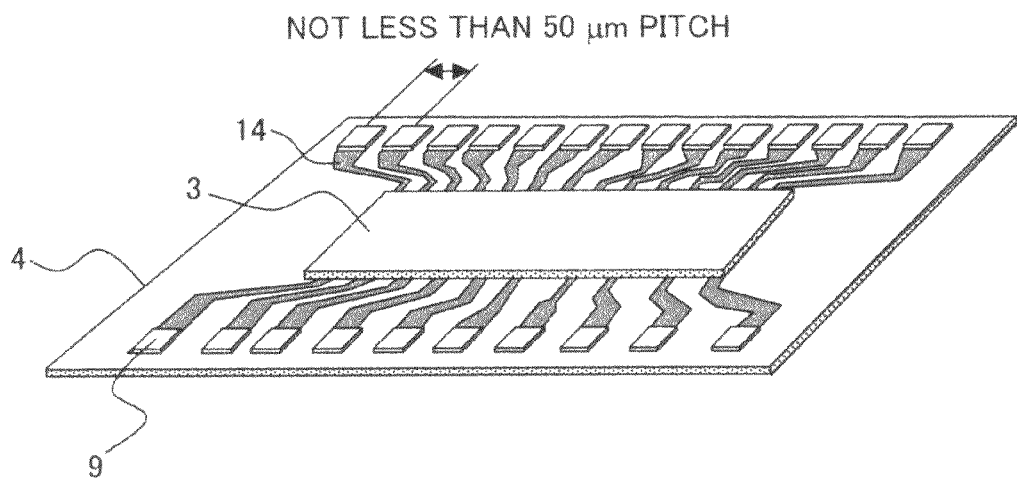
FIG. 4 is a perspective view illustrating a structure of an IC chip and an interposer provided in the IC chip mounting package illustrated in FIG. 2.
Figure 5:
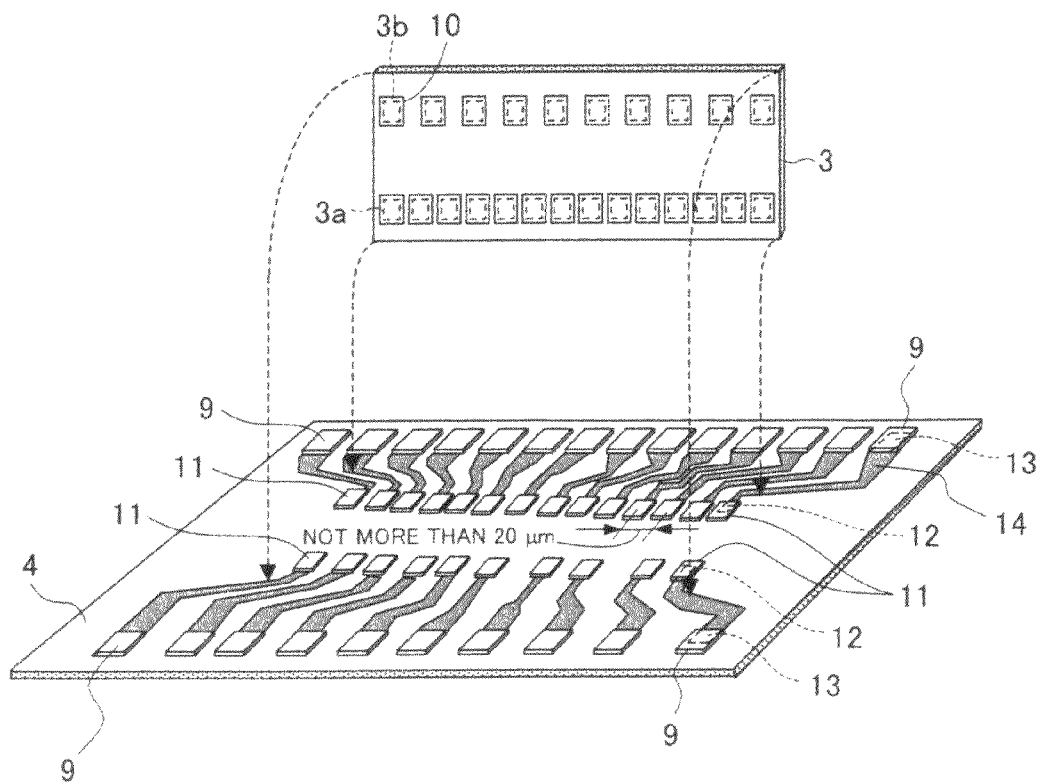
FIG. 5 is a perspective view illustrating structures of an IC chip and an interposer provided in the IC chip mounting package illustrated in FIG. 2, at a stage prior to mounting the IC chip to the interposer.

The following description specifically explains a structure of the interposer 4, with reference to FIGS. 4 and 5.

FIG. 4 is a perspective view illustrating the structure of the interposer 4 to which the IC chip 3 is mounted. FIG. 5 is a perspective view illustrating structures of the IC chip 3 and the interposer 4 at a stage prior to the mounting of the IC chip 3. Note that a part of FIG. 5 is an opened-up view.

The interposer 4 includes, as illustrated in FIG. 5, IC chip connecting terminals 12, film base member connecting terminals 13, and on-interposer wires 14. The IC chip connecting terminals 12 are terminals to be connected to respective drive signal output terminals 3a and signal input terminals 3b. The film base member connecting terminals 13 are terminals to be connected to respective terminals of the on-film wires 5 and 6 of the film base member 2. The on-interposer wires 14 are wires which connect respective IC chip connecting terminals 12 to respective film base member connecting terminals 13, on the interposer 4.

More specifically, the interposer 4 has the IC chip connecting terminals 12 provided near a center of the interposer 4, and the film base member connecting terminals 13 provided near a periphery of the interposer 4. Second bumps 11 are provided on the IC chip connecting terminals 12, and first bumps 9 are provided on the film base member connecting terminals 13. The second bumps 11 are provided so as to respectively match with third bumps 10 provided on the drive signal output terminals 3a and signal input terminals 3b. The structure illustrated in FIG. 4 is accomplished by having the second bumps 11 match with the third bumps 10, respectively.

The second bumps 2 provided on the interposer 4 have a same pitch as that of the third bumps 10 provided on the IC chip 3. Namely, since the IC chip 3 is a multi-output liquid crystal driver, the third bumps 10 are finely pitched. More specifically, the third bumps 10 are provided so as to have a pitch which exceeds 0 μm but not more than 20 μm. Consequently, the second bumps 11 are also provided so as to have a fine pitch of not more than 20 μm, as illustrated in FIG. 5.

On the other hand, the first bumps 9 of the interposer 4 have a pitch larger than the pitch of the second bumps 11. More specifically, the first bumps 9 have a pitch of not less than 50 μm, as illustrated in FIG. 4. That is to say, the film base member connecting terminals 13 on the interposer 4 have a larger pitch than that of the IC chip connecting terminals 12. Hence, the terminals of the on-film wires 5 and 6 of the film base member 2 connected via the first bumps 9 of the interposer 4 are provided so as to have a pitch of not less than 50 μm, so that the pitch of the terminals of the on-film wires 5 and 6 match with the pitch of the first bumps 9.

As such, according to the structure of the mounting package 1 of the present embodiment, the interposer 4 has the IC chip connecting terminals 12 provided so as to agree with the pitch of the terminals of the IC chip 3, and has the film base member connecting terminals 13 provided in a larger pitch than that of the IC chip connecting terminals 12. Therefore, even if the terminals of the IC chip 3 are finely pitched, the pitch of the on-film wires 5 and 6 of the film base member 2 do not need to be finely pitched so as to agree with the IC chip 3. Namely, the on-film wires 5 and 6 (inner leads) of the film base member 2 do not need to be finely pitched; the on-film wires 5 and 6 may be provided with an existing technique so as to have a pitch of not less than 50 μm. Hence, no technical innovation such as reduction in a thickness of a copper foil or any equipment such as a new processing machine for accommodating the technical innovation is necessary, and therefore an IC chip mounting package is provided which allows remarkable suppression of increase in required cost and technique.

As such, in the mounting package 1, providing the interposer 4 allows the terminals of the IC chip 3 to be finely pitched as much as possible, without the need to consider the terminal pitch of the film base member 2. This allows reduction in chip size of the IC chip 3, thereby reducing costs. As from the above, the structure of the present invention provides, by use of an existing technique and not requiring any technical innovations, an IC chip mounting package in which a finely pitched IC chip is mounted.

The present embodiment has been explained as a liquid crystal driver mounting package structured for driving a liquid crystal display. However, an IC chip mounting package of the present invention is not limited to this package. Namely, the IC chip mounting package of the present invention may be applied as a package for mounting driving elements of an EL (electroluminescence) display, or mounting elements to be mounted inside an apparatus such as various portable electronic apparatuses.

Figure 6:
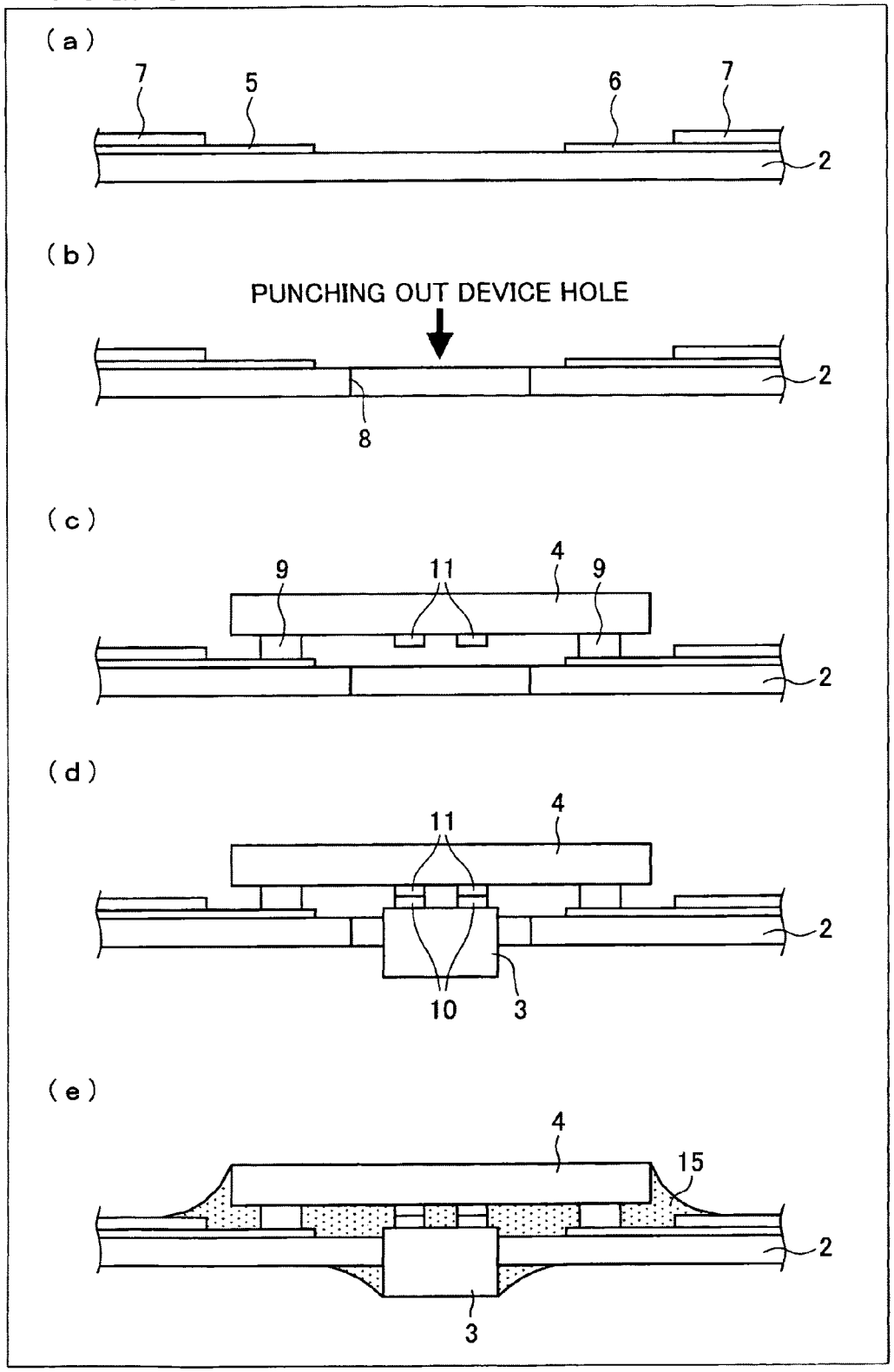
FIG. 6 (a) through (e) of FIG. 6 are cross sectional views illustrating a manufacturing procedure of the IC chip mounting package illustrated in FIG. 2.

The following description explains briefly of a procedure for manufacturing the mounting package 1 of the above structure, with reference to FIGS. 6(*a*) through 6(*e*). Wires, bumps, and other members required for the film base member 2, the IC chip 3, and the interposer 4 immediately before mounting have all been provided beforehand. Manufacturing steps as similar to manufacturing steps of a conventional IC mounting package may be carried out to provide these members; hence, detailed explanations thereof are omitted here.

FIG. 6(*a*) is an explanatory view illustrating the film base member 2 on which the IC chip 3 and the interposer 4 has not yet been mounted. The on-film wires 5 and 6 and the solder resist 7 are already provided on the film base member 2. First, as illustrated in FIG. 6(*b*), the film base member 2 is punched so as to open the device hole 8.

Next, as illustrated in FIG. 6(*c*), the interposer 4 is bonded to the film base member 2. At this point, the first bumps 9, the second bumps 11, and the on-interposer wires for connecting these bumps have already been formed on the interposer 4. The bonding of the interposer 4 is carried out by aligning respective first bumps 9 on the interposer 4 to respective connecting terminals on the film base member 2, and then heating and applying pressure thereto by use of a bonding tool.

Subsequently, as illustrated in FIG. 6(*d*), the IC chip 3 is bonded to the interposer 4. At this point, the third bumps 10 have already been provided on the IC chips 3. The bonding of the IC chip 3 is carried out by aligning respective third bumps 10 on the IC chip 3 to respective second bumps 11 on the interposer 4, and then heating and applying pressure thereto by use of the bonding tool.

Finally, as illustrated in FIG. 6(*e*), the connected section is sealed by the sealing resin 15 to protect the connected section from external environment. This completes the construction of the mounting package 1.

Steps in FIGS. 6(*a*) through 6(*e*) are carried out in a state in which the film base member 2 is of a long tape carrier material. The mounting package 1 as a final product is obtained by individually punching out mounting packages 1 from this tape carrier material.

The mounting package 1 manufactured by the foregoing steps has the problems such that inner leads peel off upon opening a device hole 8 at the punching step, and that a tape undulates upon bonding the interposer 4 to the film base member 2 at the bonding step. The mounting package of the present invention is characterized by a structure capable of suppressing such inner lead peeling and tape undulation. The following description explains the characteristic features in detail.

FIG. 1 is an explanatory drawing illustrating a structure for suppressing the inner lead peeling and tape undulation.

Among the wires provided on the film base member 2, the inner leads used for connecting the interposer 4 are, as a matter of course, provided in the vicinity of a periphery of the device hole 8. It is preferable in view of size reduction of the mounting package 1 that the inner leads have their leading ends to be in line with the periphery of the device hole 8 (that is, eliminating a margin between the leading ends of the inner leads and the periphery of the device hole 8). However, on the other hand, eliminating (or reducing a size of) the margin between the leading ends of the inner leads and the periphery of the device hole 8 causes the problem of the inner lead peeling.

The inner lead peeling occurs due to deformation of the film base member 2 at the punching step. That is to say, the punching step normally carries out punching by use of a die or a punch; at this time, the film base member 2 bends at a peripheral section of the device hole 8. Wires, that is, the inner leads, provided on the film base member 2, cannot follow this bending. As a result, the leading ends of the inner leads peel off.

In order to suppress the inner lead peeling, it is preferable to provide the inner leads by avoiding a bending region of the film base member 2 that bends at the punching step. That is to say, it is preferable for a distance (distance A in FIG. 1) between inner lead leading ends and the periphery of the device hole to be not less than an allowable value. However, it is not preferable to have an unnecessarily large distance A, since such distance A would cause an increase in area of the mounting package.

FIG. 7 is a graph illustrating a relation between (i) the distance A from the inner lead leading ends to the periphery of the device hole and (ii) a percent defective due to the inner lead peeling. As shown in FIG. 7, the distance A of 0 µm has a percent defective of 63%. As the distance A increases, the percent defective decreases; with the distance A as not less than 10 µm, the percent defective is 0%. As such, it is preferable for the distance A to be not less than 10 µm. Moreover, in mass production, it is preferable to have the distance A as not less than 30 µm, which is a margin set in view of accuracy achieved in the manufacturing steps.

The undulation of tape generates due to application of heat upon bonding at the bonding step of the interposer 4. Namely, in the bonding step, a bonding tool is pressed against a back side of the film base member 2 as illustrated in FIG. 8; and by applying heat and pressure from the bonding tool, the first bumps 9 of the interposer 4 are bonded to respective terminal sections at the inner lead leading ends.

At this time, undulation due to thermal expansion occurs to the film base member 2 by the application of heat (around 400° C.) from the bonding tool, which hinders a stable bonding. More specifically, occurrence of undulation to the film base member 2 causes a length of the film base member 2 to shorten in a terminal-aligned direction; this may cause a displacement with respect to the bumps. The displacement with respect to the bumps causes deficiency such as (i) reduction in a bonding area of the bumps and the bonding terminals, thereby causing easy peeling off of the inner leads and the bumps, and (ii) short-circuiting between adjacent wires caused by having one bump in contact with two adjacent inner leads. Such thermal expansion of the film base member 2 also occurs with the conventional SOF structure, however the structure of the present invention in which the device hole 8 is provided allows easy generation of the undulation since the film base member 2 is made as a free end at the periphery of the device hole 8.

In order to suppress the undulation of tape, it is preferable to shorten a distance between the periphery of the device hole 8 and a section at which the film base member 2 and the interposer 4 are bonded via bumps to be not more than an allowable distance. The section at which the film base member 2 and the interposer 4 are bonded via the bumps is substantially at the same position as the inner lead leading ends. Therefore, it is preferable to have a distance (distance A in FIG. 1) from the inner lead leading ends to the periphery of the device hole to be not more than the allowable value. That is, by shortening the distance A, the region to which the bonding tool is pressed (region in which thermal expansion occurs) is reduced in size. As a result, the undulation of the tape is suppressed.

Moreover, it is preferable for the bonding tool to have a dimension so that a periphery of the bonding tool and a periphery of the bumps are in line with each other, as illustrated in FIG. 1. Conventionally, the bonding tool has had its periphery larger to some extent than the periphery of the bumps. However, the structure in which the periphery of the bonding tool is in line with the periphery of the bumps allows reduction of a heated region of the film base member 2 heated by the bonding tool to the least possible. This allows further effective suppression of undulation of tape.

Figure 9:
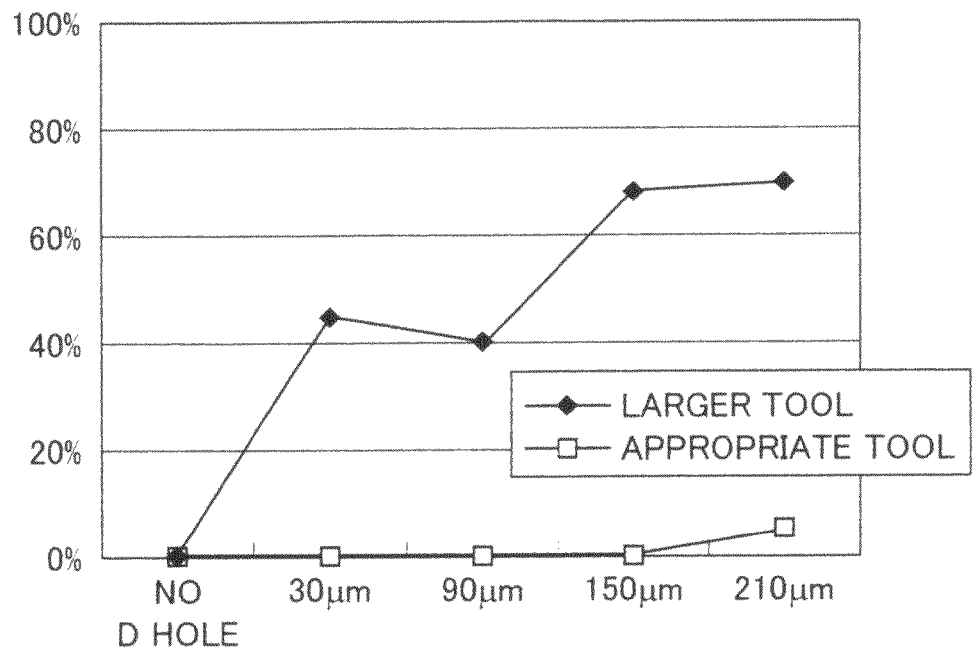
FIG. 9 is a graph illustrating a relation between (i) a distance from inner lead leading ends to a periphery of a device hole and (ii) a percent defective of an undulation of tape.

FIG. 9 is a graph illustrating a relation between (i) a distance A from inner lead leading ends to a periphery of a device hole and (ii) a percent defective due to tape undulation. Furthermore, FIG. 9 studies the percent defectives in a case where (i) the periphery of the bonding tool and the periphery of the bumps are in line with each other (appropriate tool) and (ii) the periphery of the bonding tool is set larger to some extent than the periphery of the bump (larger tool).

It is understood from FIG. 9 that the percent defective due to tape undulation decreases remarkably by having the periphery of the bonding tool and the periphery of the bumps be in line with each other, as compared to having the periphery of the bonding tool larger to some extent than the periphery of the bumps. Moreover, when focusing on just the case where the peripheries of the bonding tool and the bumps are in line with each other, the percent defective is not more than 0% in the case where the distance A is not more than 150 μm. Thus, this is preferable.

Figure 10:
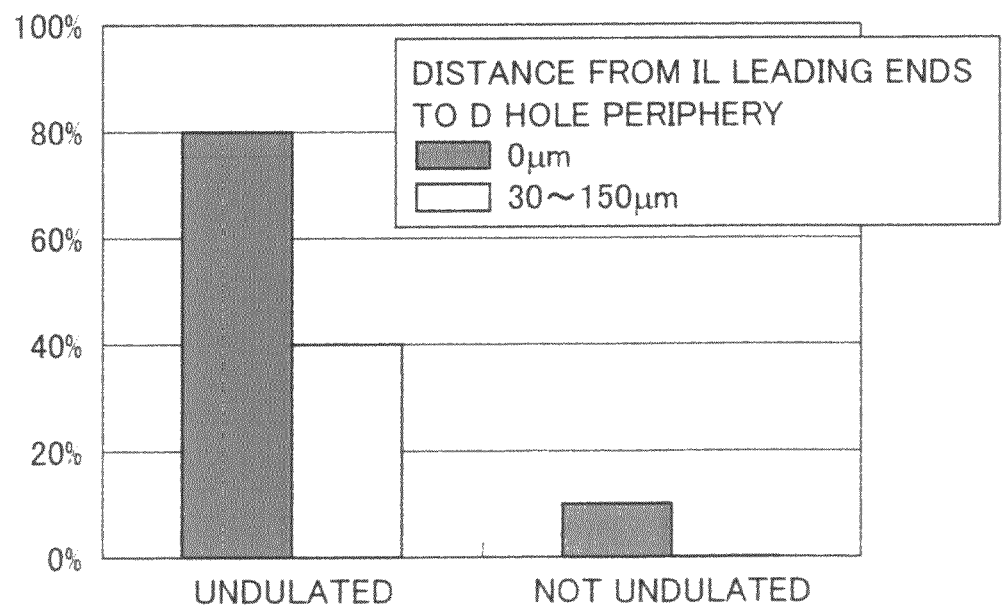
FIG. 10 is a graph illustrating a relation between (i) whether or not a film base member is undulated and (ii) occurrence of inner lead peeling after an interposer is bonded to a film base member.

FIG. 10 is a graph illustrating a relation between (i) whether or not undulation has generated to the film base member 2, and (ii) the inner lead peeling occurred followed by the bonding of the interposer 4 to the film base member 2. According to FIG. 10, inner lead peeling is remarkably reduced by suppressing the undulation of the film base member 2. Moreover, by setting the distance A from the inner lead leading ends to the periphery of the device hole in a range of 30 μm to 150 μm, and by suppressing undulation of the film base member 2, the percent defective is suppressed to 0%.

Moreover, in the mounting package 1 in accordance to the present embodiment, it is preferable to set an optimum size difference and shape of the IC chip 3, the interposer 4, and the device hole 8, in view of cost and reliability.

Figure 12:
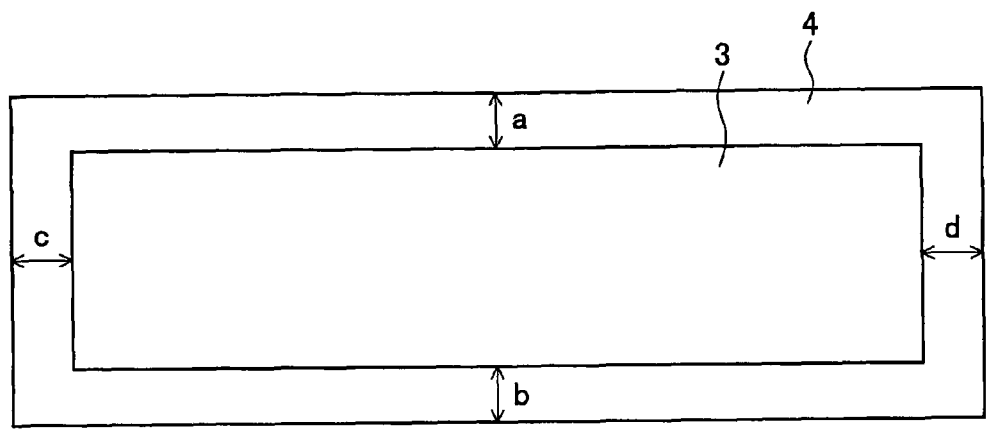
FIG. 12 is a plan view illustrating a size difference between an IC chip and an interposer in the IC chip mounting package illustrated in FIG. 2.

The first description explains a size difference between the IC chip 3 and the interposer 4, with reference to FIG. 12. In order to reduce the area of the interposer 4 to the least possible so as to reduce costs, it is preferable to shorten the distance between a periphery of the IC chip 3 and a periphery of the interposer 4 (distances a through d illustrated in FIG. 12) to as short as possible. More specifically, each of the distances a through d are preferably not less than 0.20 mm but not more than 0.46 mm.

A suitable range of the distances a through d is calculated by a sum of distances B through F illustrated in FIG. 11. The distance B is a distance from the periphery of the interposer 4 to a center of the bump 9. The distance B has an optimum size of 120 μm in view of (i) chipping measures, (ii) avoidance of contact of the inner leads and a chip edge, and (iii) chip size reduction of the interposer 4, each at a time when the interposer 4 is diced to individual chip-form from a wafer-form. The distance C is a bump size of the bump 9 (half-measure in FIG. 11). The distance C is set in view of (i) adhesion strength and bonding displacement of the bumps 9 and the interposer 4, and (ii) adhesion strength and bonding displacement of the interposer 4 and the inner leads. The distance C has an optimum size of 30 μm. The distance D is a distance from an end section of the bumps 9 to the inner lead leading ends. The distance D is set in view of (i) leading end peeling of inner leads upon bonding and (ii) a bonding tool displacement upon inner bonding displacement. The distance D has an optimum size of 10 μm. The distance E is a distance from the inner lead leading ends to respective leading ends of the film base member 2 (i.e., periphery of the device hole 8). The distance E is set in view of (i) measures against punching burr, whiskers, and leading end peeling of the inner leads, and (ii) suppression of undulation around the device hole 8 upon inner lead bonding. The distance E has an optimum size in a range of 10 μm to 50 μm. The distance F is a distance from the leading ends of the film base member 2 (i.e., the periphery of the device hole 8) to a periphery of the IC chip 3. The distance F is set in view of (i) a punching displacement upon opening the device hole to the film base member 2, (ii) a bonding displacement of the IC chip 3 and the interposer 4 upon mounting the IC chip 3, (iii) flow of resin upon sealing, and (iv) the number of obtainable IC chips based on wafer size (reflects to cost). The distance F has an optimum size in a range of 30 μm to 150 μm.

The sum of the suitable ranges for each distances B to F derives the suitable range of the distances a through d, as in a range of not less than 0.20 mm to 0.46 mm.

Setting the distances a through d in the foregoing range provides a smallest possible area of the interposer 4 with respect to an area of the IC chip 3. Moreover, a wire forming region for changing a fine pitch of an IC process level to an electrode pitch of a tape carrier level is provided on the interposer 4. Furthermore, a space is provided for setting the distance A from the inner lead leading ends to the periphery of the device hole to be in the foregoing suitable range.

It is suitable to have the distances a through d between the periphery of the IC chip 3 and the periphery of the interposer 4 to satisfy an equation of a=b=c=d so as to have the smallest possible area of the interposer 4, so that all of the distances a through d are made to be a length shortest as possible.

However, the distances a through d between the periphery of the IC chip 3 and the periphery of the interposer 4 may be taken slightly larger, by deliberately not making the values of the distances a through d as their smallest length; this allows the interposer 4 to possess other functions. For example, by having the interposer 4 have a slightly larger area, heat radiation property of the IC chip 3 improves, and rough pitch bonding which has a tape pattern pitch of not less than 35 μm can be carried out. In the case where the area of the interposer 4 is taken slightly larger, there is no need to evenly broaden the distances a through d between the periphery of the IC chip 3 and the periphery of the interposer 4; for example, the distances may be broadened so that the following relationship is satisfied: a=b>c=d, or a=b<c=d.

Moreover, when the distances satisfies a=b<c=d, reduction of tape is also possible due to simplification of wire leading on the film base member 2. When terminals provided at a bonded part of the film base member 2 and the interposer 4 have a pitch in a substantially smallest pitch level that is formable on the tape carrier, the pitch is necessarily further widened between the terminals in order to bond the film base member 2 to another external circuit board. In other words, a further fine-out is necessarily carried out on the film base member 2. This fine-out requires an extra area on the film base member 2 so as to lead the wires.

Similarly, the distances a through d may be made so as to satisfy a=b<c=d, so that a side (normally, a long side) at which many input/output terminals are provided is taken large on the interposer 4. This allows widening the terminal pitch at the bonding part of the film base member 2 and the interposer 4 to a terminal pitch so as to bond the film base member 2 to another external circuit board. In this case, a further fine-out of pitch is not required on the film base member 2 (since no extra area is necessary for leading the wires on the film base member 2). Hence, reduction of tape of the film base member 2 is possible.

Figure 13:
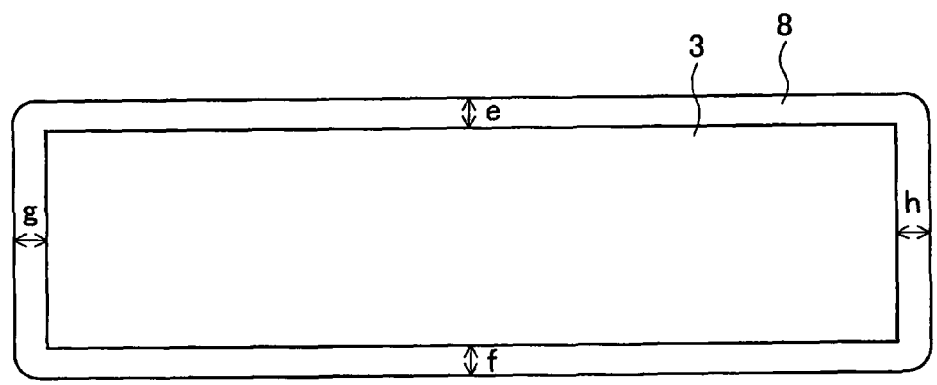
FIG. 13 is a plan view illustrating a size difference between an IC chip and an interposer in the IC chip mounting package illustrated in FIG. 2.
Figure 14:
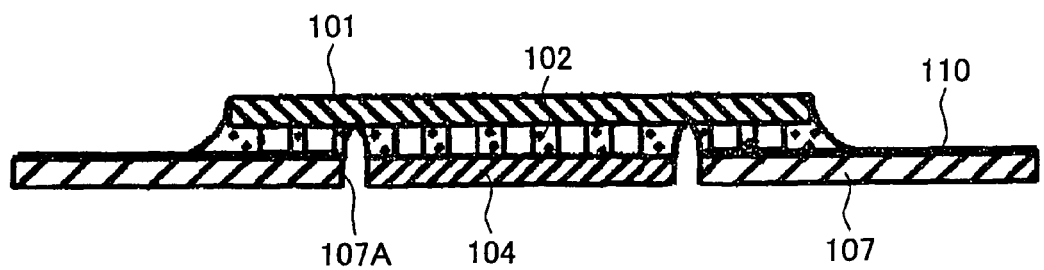
FIG. 14 is a cross sectional view illustrating a structure of a conventional technique.

The following description explains a size difference between the IC chip 3 and the device hole 8, with reference to FIG. 13. In order to accomplish reduction in area of the interposer 4 so as to reduce cost, it is preferable also for a distance between the periphery of the IC chip 3 and the periphery of the device hole 8 (distances e through h illustrated in FIG. 13) to be as short as possible. More specifically, each of the distances e through h is preferably in a range of not less than 30 µm to not more than 150 µm. The distances e through h have the same distance as the distance F illustrated in FIG. 11.

If the distance F is not more than 30 µm, an amount of resin that flows inside the device hole 8 decreases. This makes it difficult for a resin fillet to form at a cut edge of the IC chip, thereby reducing sealing strength. For example, the distance F of 20 µm generates a nonconforming item by a high percentage of 95%. On the other hand, if the distance F is not less than 150 µm, resin easily accumulates inside the device hole 8. This gives adverse effects in resin filling performance between the IC chip 3 and the interposer 4. In other words, insufficient filling of resin occurs between the IC chip 3 and the interposer 4, which causes easy generation of air bubbles. For example, the distance F of 400 µm generates a nonconforming item by a high percentage of approximately 60% (in a case where the sealing resin is potted from around the interposer 4).

Setting the distances e through h in the above range allows providing a space for setting the distance A from the inner lead leading ends to the periphery of the device hole in the foregoing suitable range while setting the area of the interposer 4 to the smallest possible with respect to the area of the IC chip 3.

It is suitable to have the distances e through h between the periphery of the IC chip 3 and the periphery of the device hole 8 to satisfy an equation of a=b=c=d so as to have a smallest possible area of the interposer 4, so that all of the distances e through h are made to be a length shortest as possible.

Moreover, it is preferable for the device hole 8 to have round corner sections so as to avoid generation of a crack or the like to the film base member 2, which crack generates from the corner sections serving as initiation points. In this case, it is preferable for the round corner to have a diameter of not more than 0.1 mm.

As described above, an IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, and leading ends of the first connection terminals being provided so as to be away from a periphery of the device hole by not less than 10 µm.

According to the structure, the IC chip and the package base member are connected via the interposer, and the IC chip is provided inside a device hole of the package base member. With this structure, wires provided on the package base member peels off at a punching step for opening the device hole, due to deformation of the package base member.

In regards to this, leading ends of connection terminals of the package base member are provided so as to be away from a periphery of the device hole by not less than 10 µm. This allows providing wires so as to avoid a region of the package base member which bends at the punching step. Hence, peeling off of the wires is suppressed.

Moreover, another IC chip mounting package in accordance with the present invention includes: an IC chip having input/output terminals; and a package base member for mounting the IC chip, the package base member having first connecting terminals, the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, and leading ends of the first connection terminals being provided so as to be away from a periphery of the device hole by not more than 150 µm.

According to the structure, the IC chip and the package base member are connected via the interposer, and the IC chip is provided inside a device hole of the package base member. With this structure, the package base member is made as a free end at a periphery of the device hole due to bonding heat at the time of bonding the interposer to the package base member. This easily causes undulation of the package base member.

In regards to this, leading ends of the connection terminals of the package base member are provided so as to be away from a periphery of the device hole by not more than 150 µm. This reduces a size of a heated region (region at which thermal expansion occurs) at the time of bonding. As a result, the undulation of the package base member is suppressed.

The IC chip mounting package may be structured such that a periphery of the IC chip is provided so as to be away from a periphery of the interposer by not less than 0.20 mm but not more than 0.46 mm.

Moreover, the IC chip mounting package may be structured such that all sides of the periphery of the IC chip are provided so as to be away from respective sides of the periphery of the interposer by a same distance.

According to the structure, an area of the interposer is made small by having a short distance between the periphery of the IC chip and the periphery of the interposer. Consequently, costs are reduced.

Moreover, the IC chip mounting package may be structured such that the periphery of the IC chip is provided so as to be away from the periphery of the interposer and so as to have a longer distance between respective long sides of the periphery of the IC chip and respective long sides of the periphery of the interposer than that between respective short sides of the periphery of the IC chip and respective short sides of the periphery of the interposer.

According to the structure, it is possible for the interposer to have other functions, by deliberately providing a longer distance between respective long sides of the peripheries of the IC chip and the interposer than the distance between respective short sides of the peripheries of the IC chip and the interposer. For example, by having the interposer have a slightly large area, heat radiation property of the IC chip is improved, and rough pitch bonding of a tape pattern pitch not less than 35 μm can be carried out.

Moreover, the IC chip mounting package may be structured such that the periphery of the IC chip is provided so as to be away from the periphery of the interposer and so as to have a longer distance between respective short sides of the periphery of the IC chip and respective short sides of the periphery of the interposer than that between respective long sides of the periphery of the IC chip and respective long sides of the periphery of the interposer.

According to the structure, the heat radiation property of the IC chip improves, and rough pitch bonding having a tape pattern pitch of not less than 35 μm can be carried out. Furthermore, the structure allows area reduction of the package base member due to simplification of the wires lead on the package base member.

Moreover, the IC chip mounting package may be structured such that a periphery of the IC chip is provided so as to be away from the periphery of the device hole by not less than 30 μm but not more than 150 μm.

Moreover, the IC chip mounting package may be structured such that all sides of the periphery of the IC chip are provided so as to be away from respective sides of the periphery of the device hole by a same distance.

According to the structure, the periphery of the IC chip and the periphery of the device hole have a short distance therebetween. This provides a space for setting the distance between connecting terminal leading ends and the periphery of the device hole in the package base member to be in the foregoing suitable range, while the interposer has a small area with respect to the area of the IC chip. Therefore, it is possible to reduce the area of the interposer. Consequently, costs are reduced.

Moreover, the IC chip mounting package may be structured such that the device hole has rounded corner sections.

Moreover, the IC chip mounting package may be structured such that the rounded corner sections of the device hole have a radius of not more than 0.1 mm.

According to the structure, it is possible to avoid generation of a crack or the like to the package base member at the corner sections, which crack is initiated at the corner sections of the device hole.

Moreover, a method in accordance to the present invention for manufacturing an IC chip mounting package, the IC chip mounting package including an IC chip having input/output terminals and a package base member for mounting the IC chip, the package base member having first connection terminals, is a method including the step of: connecting the IC chip and the package base member via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the package base member and the interposer being connected by bonding bump electrodes to the respective first connecting terminals, the bump electrodes being provided on the respective first connecting terminals, the bonding being carried out by using a bonding tool that has a dimension so that a periphery of the bonding tool and a periphery of the bump electrodes are in line with each other.

According to the structure, the package base member has a smallest possible heated region to which heat is applied by the bonding tool. This suppresses the undulation of the package base member.

The invention claimed is:

1. An IC chip mounting package comprising:
an IC chip having input/output terminals; and
a package base member for mounting the IC chip, the package base member having first connecting terminals,
the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals,
the IC chip being provided inside a device hole of the package base member,
leading ends of the first connecting terminals being provided so as to be away from a periphery of the device hole by not less than 10 μm, and
a periphery of the IC chip is provided so as to be away from a periphery of the interposer by not less than 0.20 mm but not more than 0.46 mm.

2. The IC chip mounting package as set forth in claim 1, wherein all sides of the periphery of the IC chip are provided so as to be away from respective sides of the periphery of the interposer by a same distance.

3. The IC chip mounting package as set forth in claim 1, wherein the periphery of the IC chip is provided so as to be away from the periphery of the interposer and so as to have a longer distance between respective long sides of the periphery of the IC chip and respective long sides of the periphery of the interposer than that between respective short sides of the periphery of the IC chip and respective short sides of the periphery of the interposer.

4. The IC chip mounting package as set forth in claim 1, wherein the periphery of the IC chip is provided so as to be away from the periphery of the interposer and so as to have a longer distance between respective short sides of the periphery of the IC chip and respective short sides of the periphery of the interposer than that between respective long sides of the periphery of the IC chip and respective long sides of the periphery of the interposer.

5. The IC chip mounting package as set forth in claim 1, wherein a periphery of the IC chip is provided so as to be away from the periphery of the device hole by not less than 30 μm but not more than 150 μm.

6. The IC chip mounting package as set forth in claim 5, wherein all sides of the periphery of the IC chip are provided so as to be away from respective sides of the periphery of the device hole by a same distance.

7. The IC chip mounting package as set forth in claim 1, wherein the device hole has rounded corner sections.

8. The IC chip mounting package as set forth in claim 7, wherein the rounded corner sections of the device hole have a radius of not more than 0.1 mm.

9. An IC chip mounting package comprising:
an IC chip having input/output terminals; and
a package base member for mounting the IC chip, the package base member having first connecting terminals,
the IC chip and the package base member being connected via an interposer which includes (i) second connecting terminals, on a side of the package base member, which are arranged so as to be connected to the first connecting terminals, respectively, (ii) third connecting terminals, on a side of the IC chip, which are arranged so as to be connected to the input/output terminals, respectively, and (iii) respective wires for connecting the second connecting terminals and the third connecting terminals, the IC chip being provided inside a device hole of the package base member, leading ends of the first connection terminals being provided so as to be away from a periphery of the device hole by not more than 150 µm, and a periphery of the IC chip is provided so as to be away from a periphery of the interposer by not less than 0.20 mm but not more than 0.46 mm.

10. The IC chip mounting package as set forth in claim 9, wherein all sides of the periphery of the IC chip are provided so as to be away from respective sides of the periphery of the interposer by a same distance.

11. The IC chip mounting package as set forth in claim 9, wherein the periphery of the IC chip is provided so as to be away from the periphery of the interposer and so as to have a longer distance between respective long sides of the periphery of the IC chip and respective long sides of the periphery of the interposer than that between respective short sides of the periphery of the IC chip and respective short sides of the periphery of the interposer.

12. The IC chip mounting package as set forth in claim 9, wherein the periphery of the IC chip is provided so as to be away from the periphery of the interposer and so as to have a longer distance between respective short sides of the periphery of the IC chip and respective short sides of the periphery of the interposer than that between respective long sides of the periphery of the IC chip and respective long sides of the periphery of the interposer.

13. The IC chip mounting package as set forth in claim 9, wherein a periphery of the IC chip is provided so as to be away from the periphery of the device hole by not less than 30 µm but not more than 150 µm.

14. The IC chip mounting package as set forth in claim 13, wherein all sides of the periphery of the IC chip are provided so as to be away from respective sides of the periphery of the device hole by a same distance.

15. The IC chip mounting package as set forth in claim 9, wherein the device hole has rounded corner sections.

16. The IC chip mounting package as set forth in claim 15, wherein the rounded corner sections of the device hole have a radius of not more than 0.1 mm.

\* \* \* \* \*